(12) United States Patent
Halbawi et al.

(10) Patent No.: US 10,425,106 B2
(45) Date of Patent: Sep. 24, 2019

(54) BALANCED REED-SOLOMON CODES

(71) Applicant: California Institute of Technology, Pasadena, CA (US)

(72) Inventors: Wael Halbawi, Pasadena, CA (US); Babak Hassibi, San Marino, CA (US); Zihan Liu, Berkeley, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 15/824,948

(22) Filed: Nov. 28, 2017

(65) Prior Publication Data

US 2018/0152204 A1    May 31, 2018

Related U.S. Application Data

(60) Provisional application No. 62/426,821, filed on Nov. 28, 2016.

(51) Int. Cl.
   *H03M 13/15*      (2006.01)
   *G06F 11/10*      (2006.01)
   *H03M 13/37*      (2006.01)

(52) U.S. Cl.
   CPC ..... *H03M 13/1515* (2013.01); *G06F 11/1044* (2013.01); *G06F 11/1076* (2013.01); *H03M 13/3761* (2013.01); *G06F 2211/1028* (2013.01); *G06F 2211/1057* (2013.01)

(58) Field of Classification Search
   CPC .......... H03M 13/1515; H03M 13/3761; G06F 11/1044; G06F 11/1076; G06F 2211/1028; G06F 2211/1057
See application file for complete search history.

(56) References Cited

U.S. PATENT DOCUMENTS 4,633,470 A    12/1986   Welch et al.
5,790,570 A *   8/1998   Heegard ............. H03M 13/251
                                                                    375/262

(Continued)

OTHER PUBLICATIONS

D. J. C. MacKay, "Good error-correcting codes based on very sparse matrices," in IEEE Transactions on Information Theory, vol. 45, No. 2, pp. 399-431, Mar. 1999.*

(Continued)

*Primary Examiner* — Cynthia Britt

(74) *Attorney, Agent, or Firm* — KPPB LLP

(57) ABSTRACT

Balanced Reed-Solomon codes in accordance with embodiments of the invention enable balanced load in distributed storage systems. One embodiment includes a storage controller, wherein the storage processor is configured by the controller Reed-Solomon application to: receive a data segment; partition the data segment into a first block of data and a second block of data; transmit the first block of data to a first node controller in the plurality of node controllers; transmit the second block of data to a second node controller in the plurality of node controllers; wherein the node processor in the first node controller is configured by the node Reed-Solomon application to: receive the first block of data; encode the first block of data using a balanced and sparsest error-correcting code; and store the encoded first block of data in the node memory of the first node controller.

21 Claims, 6 Drawing Sheets

(56) References Cited

U.S. PATENT DOCUMENTS

| | | | | |
|---|---|---|---|---|
| 2007/0198890 | A1* | 8/2007 | Dholakia | H03M 13/036 714/758 |
| 2009/0019335 | A1* | 1/2009 | Boyer | H03M 13/1105 714/755 |
| 2012/0054585 | A1* | 3/2012 | Jiang | H03M 13/1111 714/777 |
| 2014/0298129 | A1* | 10/2014 | Wu | H03M 13/116 714/752 |
| 2015/0242484 | A1* | 8/2015 | Zhao | G06F 17/30312 707/755 |
| 2015/0317203 | A1* | 11/2015 | Zhou | G06F 11/1044 714/773 |

OTHER PUBLICATIONS

W. Halbawi, Z. Liu and B. Hassibi, "Balanced Reed-Solomon codes," 2016 IEEE International Symposium on Information Theory (ISIT), Barcelona, 2016, pp. 935-939.*

W. Halbawi, Z. Liu and B. Hassibi, "Balanced Reed-Solomon codes for all parameters," 2016 IEEE Information Theory Workshop (ITW), Cambridge, 2016, pp. 409-413.*

S. H. Dau, W. Song, Z. Dong and C. Yuen, "Balanced Sparsest generator matrices for MDS codes," 2013 IEEE International Symposium on Information Theory, Istanbul, 2013, pp. 1889-1893.*

"Amazon S3 Glacier", Amazon, Retrieved from: https://aws.amazon.com/glacier, 2017, 11 pgs.

"Archival Cloud Storage: Nearline & Coldline", GoogleCloud, Retrieved from: https://cloud.google.com/storage/archival, 2017, 9 pgs.

Bandaru et al., "Under the hood: Facebook's cold storage system", Facebook Code, Retrieved from: https://code.fb.com/production-engineering/-under-the-hood-facebook-s-cold-storage-system-/, May 4, 2015, 7 pgs.

Blaum et al., "EVENODD: an efficient scheme for tolerating double disk failures in RAID architectures", IEEE Transactions on Computers, vol. 44, Issue 2, Feb. 1995, pp. 192-202.

Blaum et al., "On Lowest Density MDS Codes", IEEE Transactions on Information Theory, Jan. 1999, vol. 45, No. 1, pp. 46-59.

Chen et al., "RAID: High-performance, Reliable Secondary Storage", ACM Comput. Surv., Jun. 1994, Vo. 26, No. 2, pp. 145-185.

Dau et al., "Balanced Sparset Generator Matrices for MDS Codes", IEEE International Symposium on Information Theory, Jan. 22, 2013, pp. 1889-1893, arXiv:1301.5108.

Dau et al., "Constructions of MDS codes via random Vandermonde and Cauchy matrices over small fields", 53rd Annual Allerton Conference on Communication, Control, and Computing, Monticello, Illinois, Sep. 29-Oct. 2, 2015.

Dau et al., "On Simple Multiple Access Networks", IEEE Journal on Selected Areas in Communications, Feb. 2015, vol. 33, No. 2, pp. 236-249.

Dau et al., "On the Existence of MDS Codes Over Small Fields With Constrained Generator Matrices", 2014 IEEE International Symposium on Information Theory (ISIT), Jun. 2014, pp. 1787-1791.

Dimakis et al., "Decentralized Erasure Codes for Distributed Networked Storage", IEEE/ACM Transactions on Networking (TON)—Special issue on Networking and Information Theory, 2006, vol. 52, No. 6, pp. 2809-2816; arXiv:cs/0606049.

Gabidulin, "Theory of Codes with Maximum Rank Distance", Problemy Peredachi Informatsii, Jan. 1985, vol. 31, No. 1, pp. 3-16.

Gopalan et al., "On the Locality of Codeword Symbols", IEEE Transactions on Information Theory, vol. 58, No. 11, Nov. 2012, pp. 6925-6934.

Guruswami et al., "Improved Decoding of Reed-Solomon and Algebraic-Geometry Codes", IEEE Transactions on Information Theory, Oct. 23, 1999, vol. 45, No. 6, pp. 1757-1767.

Halbawi et al., "Balanced and Sparse Tamo-Barg Codes", Proceedings of the IEEE International Symposium on Information Theory (ISIT), Aachen, Germany, Jun. 25-30, 2017.

Halbawi et al., "Balanced Reed-Solomon Codes", International Symposium on Information Theory, Jan. 27, 2016, 11 pgs., arXiv:1601.07283.

Halbawi et al., "Coding with Constraints: Minimum Distance Bounds and Systematic Constructions", in IEEE International Symposium on Information Theory (ISIT), Jun. 2015, pp. 1302-1306.

Halbawi et al., "Distributed Gabideulin codes for Multiple-Source Network Error Correction", in IEEE International Symposium on Network Coding (NetCod), Jun. 2014, pp. 1-6.

Halbawi et al., "Distributed Reed-Solomon Codes for Simple Multiple Access Networks", in 2014 IEEE International Symposium on Information Theory, Jun. 2014, pp. 651-655.

Huang et al., "Pyramid Codes: Flexible Schemes to Trade Space for Access Efficiency in Reliable Data Storage Systems", Proceedings of the 6th IEEE International Symposium on Network Computing and Applications (NCA 2007), Cambridge, Massachusetts, Jul. 12-14, 2007, 8 pgs.

Kamath et al., "Codes Wth Local Regeneration and Erasure Correction", IEEE Transactions on Information Theory, vol. 60, No. 8, Aug. 2014, pp. 4637-4660.

Louidor et al., "Lowest-Density MDS Codes over Extension Alphabets", IEEE Transactions on Information Theory, Aug. 2006, vol. 52, No. 7, pp. 3186-3197.

Massey, "Shift-register synthesis and BCH decoding", IEEE Transactions on Information Theory, Jan. 1969, vol. 15, No. 1, pp. 122-127.

Muralidhar et al., "f4: Facebook's Warm BLOB storage System", 11th USENIX Symposium on Operating Systems Design and Implementation (OSDI 14) Oct. 6-8, 2014, pp. 383-398.

Pamies-Juarez et al., "RapidRAID: Pipelined erasure codes for fast data archival in distributed storage systems", Proc.—IEEE INFOCOM, Aug. 3, 2012, pp. 1294-1302, arXiv:1207.67442.

Papailiopoulos et al., "Locally repairable codes", Proceedings of the IEEE International Symposium on Information Theory, Cambridge, Massachusetts, Jul. 1-6, 2012, pp. 2771-2775.

Reed et al., "Polynomial codes over certain finite fields", J. Soc. Ind. Appl Math., 1960.

Sathiamoorthy et al., "XORing Elephants: Novel Erasure Codes for Big Data", 39th International Conference on Very Large Data Bases, Riva del Garda, Trento, Italy, vol. 6, No. 5, Aug. 26-30, 2013, pp. 325-336.

Silberstein et al., "Optimal Locally Repairable Codes via Rank Metric Codes", arXiv:1301.6331v1 [cs.IT], Jan. 27, 2013, 6 pgs.

Silva et al., "A Rank-Metric approach to Error Control in Random Network Coding", IEEE Transactions on Information Theory, Sep. 2008, vol. 54, No. 9, pp. 3951-3967.

Tamo et al., "A Family of Optimal Locally Recoverable Codes", IEEE Transactions on Information Theory, vol. 60, No. 8, Aug. 2014, pp. 4661-4676.

Tamo et al., "Cyclic LRC codes and their subfield subcodes", arXiv:1502.01414v1 [cs.IT], Feb. 5, 2015, 6 pgs.

Xu et al., "Low-Density MDS Codes and Factors of Complete Graphs", IEEE Transactions on Information Theory, vol. 45, No. 6, Sep. 1999, pp. 1817-1826.

Yan et al., "Weakly Secure Data Exchange with Generalized Reed Solomon Codes", Proceedings of the IEEE International Symposium on Information Theory, Honolulu, Hawaii, Jun. 29-Jul. 4, 2014, pp. 1366-1370.

Yan et al., "Weakly Secure Network Coding for Wireless Cooperative Data Exchange", IEEE Global Telecommunications Conference—GLOBECOM 2011, Kathmandu, Nepal, Dec. 5-9, 2011.

* cited by examiner

BALANCED REED-SOLOMON CODES

CROSS-REFERENCE TO RELATED APPLICATIONS

The present invention claims priority to U.S. Provisional Patent Application Ser. No. 62/426,821 entitled "Balanced Reed-Solomon Codes" to W. Halbawi et al., filed Nov. 28, 2016. The disclosure of U.S. Provisional Patent Application Ser. No. 62/426,821 is herein incorporated by reference in its entirety.

STATEMENT OF FEDERALLY SPONSORED RESEARCH

This invention was made with government support under Grant No(s). CNS0932428 & CCF1018927 & CCF1423663 & CCF1409204 awarded by the National Science Foundation. The government has certain rights in the invention.

FIELD OF THE INVENTION

The present invention generally relates to error correcting codes and more specifically relates to Reed-Solomon codes.

BACKGROUND

Digital media is being created and stored at a unprecedented rate. Robust error free storage can be achieved with error-correcting codes. Generally, error correcting codes are processes of adding redundant data to a message so that the message can be recovered even when errors are introduced. These errors can be introduced in a number of ways including (but not limited to) during the transmission of the message.

In addition to correcting smaller errors in data, steps can be taken to recover large portions of data when, for example, an entire hard disk is lost. Redundant Array of Independent (or Inexpensive) Disks (RAID) is a common configuration of disk drives that can distribute data such that data set can be rebuilt after the failure of one (or potentially more) individual disks.

SUMMARY OF THE INVENTION

Systems and methods are described balanced Reed-Solomon codes in accordance with embodiments of the invention enable balanced load in distributed storage systems. One embodiment includes a distributed storage node controller, comprising: a network interface; a processor; a memory containing: a Reed-Solomon node application; wherein the processor is configured by the Reed-Solomon node application to: receive a block of data using the network interface; encode the block of data using a balanced and sparsest error-correcting code; and store the encoded block of data in the memory.

In a further embodiment, the block of data is a portion of a data segment divided into a plurality of equally sized blocks of data.

In another embodiment, the error-correcting code is a balanced and sparsest Reed-Solomon code.

In a still further embodiment, the balanced and sparsest Reed-Solomon code further comprises transforming the block of data by a Reed-Solomon generator matrix.

In still another embodiment, the Reed-Solomon generator matrix is calculated by transforming a set of Reed-Solomon codewords with a mask that satisfies balanced and sparsest constraints.

In a yet further embodiment, the mask is selected from rows of a matrix that comprises zeros and ones and satisfies balanced and sparsest constraints.

In yet another embodiment, every row in the matrix has the same weight.

In a further embodiment again, every column in the matrix has a weight that differs by at most one.

In another embodiment again, the Reed-Solomon generator matrix with parameters [6,4] defined over $\mathbb{F}_5$ can be evaluated by the processor using the following expression:

$$G = \begin{bmatrix} 3 & 1 & 4 & 0 & 0 & 0 \\ 0 & 0 & 0 & 3 & 1 & 4 \\ 0 & 3 & 1 & 4 & 0 & 0 \\ 4 & 0 & 0 & 0 & 3 & 1 \end{bmatrix}.$$

wherein G is the Reed-Solomon generator matrix, [6,4] are dimensions of the generator matrix, and $\mathbb{F}_5$ defines the dimensions of the subspace.

In a further additional embodiment, the Reed-Solomon generator matrix with parameters [15, 10] defined over $\mathbb{F}_{2^4}$ can be evaluated by the processor using the following expression:

$$G_{15,10} = \begin{bmatrix} \alpha^8 & \alpha^9 & \alpha^{13} & \alpha^{10} & 1 & \alpha^8 & 0 & 0 & 0 & 0 & 0 & 0 & 0 & 0 & 0 \\ 0 & 0 & 0 & 0 & 0 & 0 & \alpha^8 & \alpha^9 & \alpha^{13} & \alpha^{10} & 1 & \alpha^8 & 0 & 0 & 0 \\ \alpha^{10} & 1 & \alpha^8 & 0 & 0 & 0 & 0 & 0 & 0 & 0 & 0 & 0 & \alpha^8 & \alpha^9 & \alpha^{13} \\ 0 & 0 & 0 & \alpha^8 & \alpha^9 & \alpha^{13} & \alpha^{10} & 1 & \alpha^8 & 0 & 0 & 0 & 0 & 0 & 0 \\ 0 & 0 & 0 & 0 & 0 & 0 & 0 & 0 & 0 & \alpha^8 & \alpha^9 & \alpha^{13} & \alpha^{10} & 1 & \alpha^8 \\ 0 & \alpha^8 & \alpha^9 & \alpha^{13} & \alpha^{10} & 1 & \alpha^8 & 0 & 0 & 0 & 0 & 0 & 0 & 0 & 0 \\ 0 & 0 & 0 & 0 & 0 & 0 & 0 & \alpha^8 & \alpha^9 & \alpha^{13} & \alpha^{10} & 1 & \alpha^8 & 0 & 0 \\ \alpha^{13} & \alpha^{10} & 1 & \alpha^8 & 0 & 0 & 0 & 0 & 0 & 0 & 0 & 0 & 0 & \alpha^8 & \alpha^9 \\ 0 & 0 & 0 & 0 & \alpha^8 & \alpha^9 & \alpha^{13} & \alpha^{10} & 1 & \alpha^8 & 0 & 0 & 0 & 0 & 0 \\ \alpha^8 & 0 & 0 & 0 & 0 & 0 & 0 & 0 & 0 & 0 & \alpha^8 & \alpha^9 & \alpha^{13} & \alpha^{10} & 1 \end{bmatrix}.$$

wherein G is the Reed-Solomon generator matrix, [15, 10] are dimensions of the generator matrix, and $\mathbb{F}_{2^4}$ defines the dimensions of the subspace, and $\alpha$ is a primitive in $\mathbb{F}_{2^4}$.

In another additional embodiment, the Reed-Solomon generator matrix with parameters [14, 10] defined over $\mathbb{F}_{2^4}$ can be evaluated by the processor using the following expression:

$$G_{14,10} = \begin{bmatrix} \alpha^8 & \alpha^9 & \alpha^{13} & \alpha^{10} & 1 & \alpha^8 & 0 & 0 & 0 & 0 & 0 & 0 & 0 & 0 \\ 0 & 0 & 0 & 0 & 0 & 0 & \alpha^8 & \alpha^9 & \alpha^{13} & \alpha^{10} & 1 & \alpha^8 & 0 & 0 \\ \alpha^{10} & 1 & \alpha^8 & 0 & 0 & 0 & 0 & 0 & 0 & 0 & 0 & 0 & \alpha^8 & \alpha^9 \\ 0 & 0 & 0 & \alpha^8 & \alpha^9 & \alpha^{13} & \alpha^{10} & 1 & \alpha^8 & 0 & 0 & 0 & 0 & 0 \\ 0 & 0 & 0 & 0 & 0 & 0 & 0 & 0 & 0 & \alpha^8 & \alpha^9 & \alpha^{13} & \alpha^{10} & 1 \\ 0 & \alpha^8 & \alpha^9 & \alpha^{13} & \alpha^{10} & 1 & \alpha^8 & 0 & 0 & 0 & 0 & 0 & 0 & 0 \\ 0 & 0 & 0 & 0 & 0 & 0 & 0 & \alpha^8 & \alpha^9 & \alpha^{13} & \alpha^{10} & 1 & \alpha^8 & 0 \\ \alpha^{13} & \alpha^{10} & 1 & \alpha^8 & 0 & 0 & 0 & 0 & 0 & 0 & 0 & 0 & 0 & \alpha^8 \\ 0 & 0 & 0 & 0 & \alpha^8 & \alpha^9 & \alpha^{13} & \alpha^{10} & 1 & \alpha^8 & 0 & 0 & 0 & 0 \\ \alpha^8 & 0 & 0 & 0 & 0 & 0 & 0 & 0 & 0 & 0 & \alpha^8 & \alpha^9 & \alpha^{13} & \alpha^{10} \end{bmatrix}$$

wherein wherein G is the Reed-Solomon generator matrix. [14, 10] are dimensions of the generator matrix, and $\mathbb{F}_{2^4}$ defines the dimensions of the subspace, and α is a primitive in $\mathbb{F}_{2^4}$.

In a still yet further embodiment, A distributed storage network, comprising: a communications network; a storage controller, comprising: a storage network interface; a storage processor; a storage memory containing a storage Reed-Solomon application; a plurality of node controllers, comprising: a node network interface; a node processor; a node memory containing a node Reed-Solomon application; wherein the storage processor is configured by the controller Reed-Solomon application to: receive a data segment; partition the data segment into a first block of data and a second block of data; transmit the first block of data to a first node controller in the plurality of node controllers; transmit the second block of data to a second node controller in the plurality of node controllers; wherein the node processor in the first node controller is configured by the node Reed-Solomon application to: receive the first block of data; encode the first block of data using a balanced and sparsest error-correcting code; and store the encoded first block of data in the node memory of the first node controller.

In still yet another embodiment, the first block of data and the second block of data are equal sized.

In a still further embodiment again, the error-correcting code is a balanced and sparsest Reed-Solomon code.

In still another embodiment again, wherein the balanced and sparsest Reed-Solomon code further comprises transforming the first block of data by a Reed-Solomon generator matrix.

Another further embodiment of the method of the invention includes: the Reed-Solomon generator matrix is calculated by transforming a set of Reed-Solomon codewords with a mask that satisfies the balanced and sparsest constraints.

Still another further embodiment of the method of the invention includes: the mask is selected from rows of a generator matrix that comprises zeros and ones and satisfies further balanced and sparsest constraints.

In a further embodiment, every row in the matrix has the same weight.

In yet another embodiment, every column in the matrix has a weight that differs by at most one.

In another additional embodiment, the storage processor is further configured by the controller Reed-Solomon application to: detect an erasure of the second block of data; retrieve blocks of data including at least the first block of data from the plurality of node controllers; and reconstruct the second block of data using a Reed-Solomon generator matrix and the retrieved blocks of data.

In another embodiment again, A distributed storage method, comprising: running a storage Reed-Solomon application contained in a storage memory using a storage controller, wherein the storage controller has a storage network interface, a storage processor, and a storage memory connected to the processor; receiving a data segment using the storage controller; partitioning the data segment into a first block of data and a second block of data; transmitting the first block of data to a first node controller, wherein the first node controller has a first node network interface, a first node processor, a first node memory connected to the first node processor, and a first node Reed-Solomon application contained in the first node memory; transmitting the second block of data to a second node controller, wherein the second node controller has a second node network interface, a second node processor, a second node memory connected to the second node processor, and a second node Reed-Solomon application contained in the second node memory; receiving the first block of data using the first node controller; encoding the first block of data using a balanced and sparsest error-correcting code and the first node controller; and storing the encoded first block of data in the first node memory using the first node controller.

In a still yet further embodiment, further comprising: detecting an erasure of the second block of data using the storage controller, retrieving blocks of data from a plurality of node controllers including at least the first block of data from the first node controller using the storage controller; and reconstructing the second block of data using a Reed-Solomon generator matrix and the retrieved blocks of data using the storage controller.

DETAILED DESCRIPTION

Figure 1A:
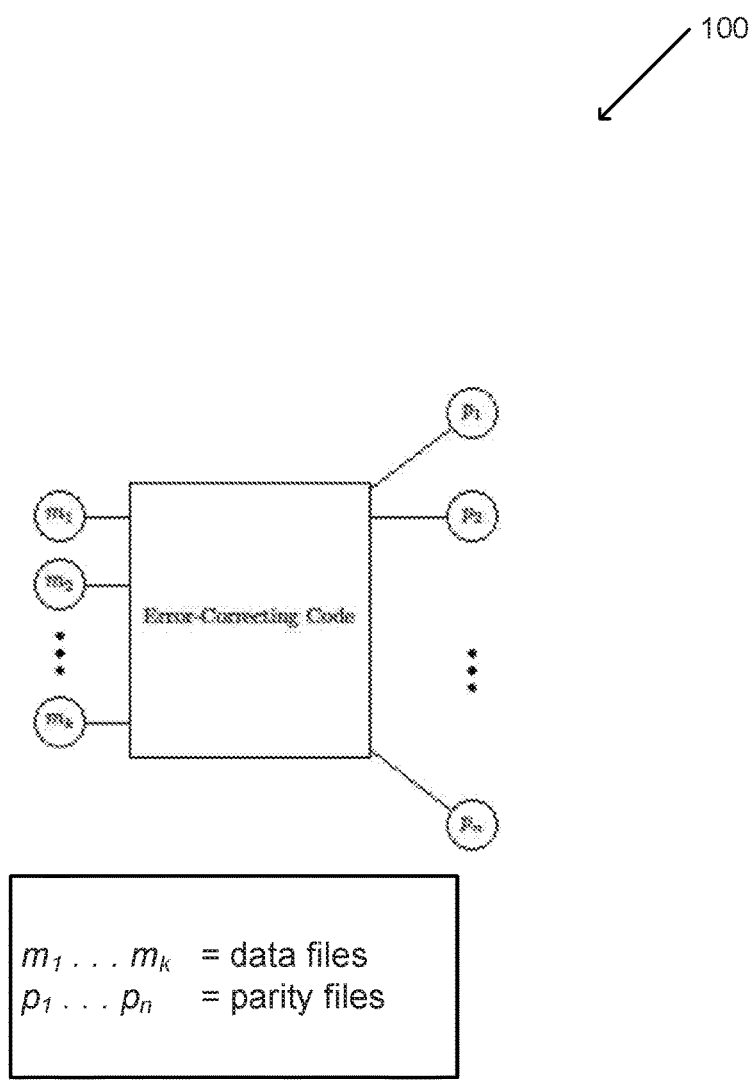
FIG. 1A is a conceptual illustration of an error-correcting code mapping a set of data to a set of parity files.
Figure 1B:
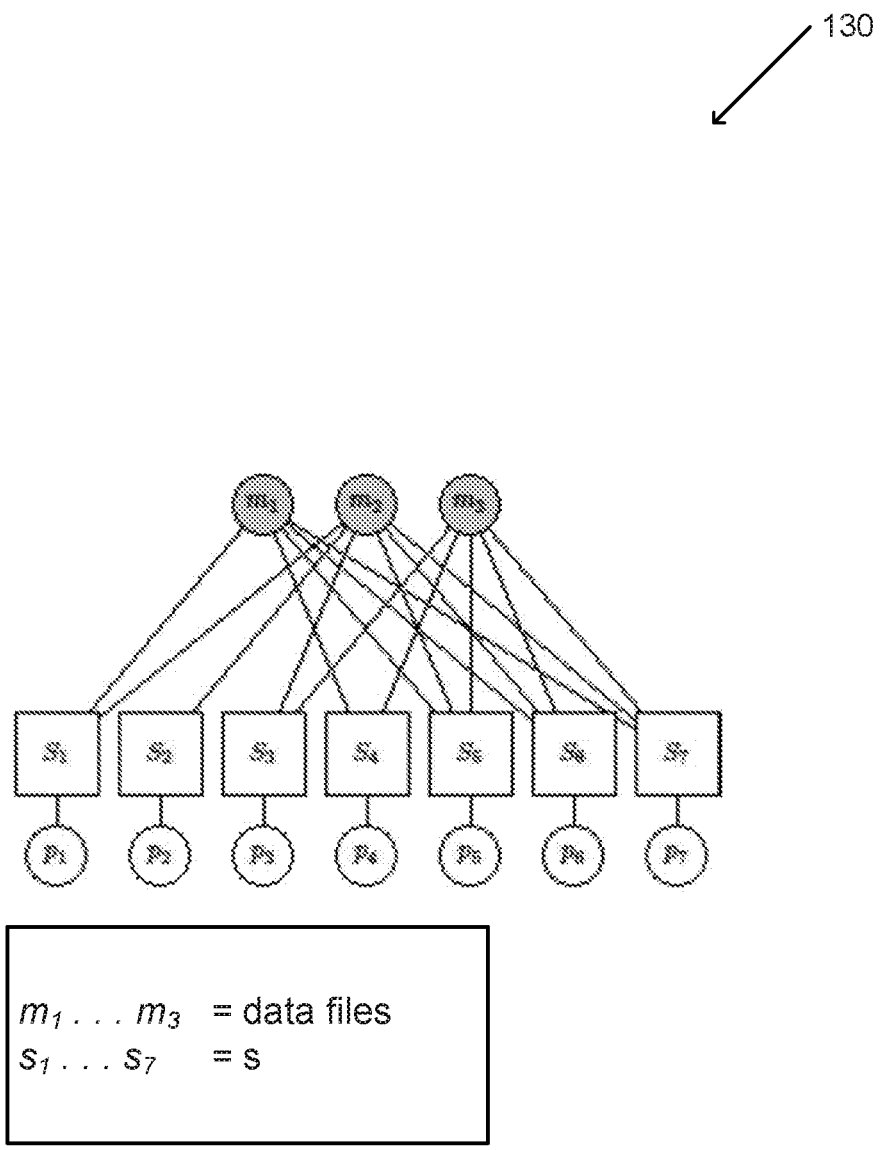
FIG. 1B is a conceptual illustration of a distributed storage network in which a set of files can be stored on a set of servers.

Turning now to the drawings, systems and methods for distributed data storage using sparse and balanced Reed-Solomon codes in accordance with various embodiments of the invention are illustrated. Reed-Solomon codes (RS codes) are a type of classical error-correcting code that are non-binary cyclic error-correcting codes. As a classical example, error-correcting codes can map a set of data to a set of parity files. FIG. 1A illustrates an error-correcting code which maps a set of k data files $m_1, \ldots m_k$ to a set of parity files $p_1, \ldots p_n$. The data files can be recovered from the n parity files if the number of errors is not too high. This threshold can be determined by the mapping the produces the parity files from the data. FIG. 1B illustrates a distributed storage network in which a collection of files can be stored, where a collection of files $m_1$, $m_2$, and $m_3$ can be stored on a set of servers $S_1, \ldots, S_7$. $S_i$ can store a parity file $p_i$, which can be a function of the files it is connected to. As an illustrative example, server $S_3$ is connected to $m_2$ and $m_3$.

RS codes generally can detect and/or correct multiple symbol errors in a piece of data. RS codes can also be used as erasure codes, which can correct known erasures in data. Additionally, RS codes can be used to correct both errors and erasures. Efficient known encoders and decoders have been developed for RS codes. In several embodiments, RS codes can be created by multiplying input data by a generator matrix.

In distributed data storage, a computer network can store information in more than one node, often replicating the information. These networks typically use error correction techniques to reproduce the data if it becomes damaged or otherwise unavailable. Error correction techniques are generally directed toward configuring individual drives in a Redundant Array of Independent (or Inexpensive) Disks (RAID) configuration. Failures of entire drives within a RAID configuration are typically handled by replicating data across many nodes (drives) which can be inefficient. In contrast, Reed-Solomon processes in accordance with embodiments of the invention can generally allow no and/or fewer replications of data across many nodes. Additionally, when data is stored in a distributed system using cloud computing, individual data storage locations can be physically spread out (i.e., data centers in different locations). This can create additional constraints on where individual portions of data can be stored. As an illustrative example, a constraint can be that individual data centers can only access a specific portion of the data set.

A balanced RS code can evenly distribute computational load. Every code symbol in a balanced RS code can be computed in roughly the same amount of time. Computational load is balanced across the storage system which generally means no storage nodes are bottlenecks. In some embodiments, changing a single message symbol in a balanced RS code requires recomputing the least number of code symbols. A generator matrix for a balanced RS code generally has the number of nonzeros in any two columns differing by at most one. In many embodiments, a balanced RS code can divide up data to be encoded across multiple storage nodes, where each node uses the data available to it (which is generally less than the entire data set) to encode and/or decode the data that it stores. As such, processing load for encoding data can be distributed across a cluster of devices.

A sparse RS code is one in which most of the elements of its generator matrix are zero. Similarly, the sparsest RS code is one in which the rows of its generator matrix has the least possible number of nonzeros. In many embodiments, sparse RS codes do not need to access the entire data set to encode an individual piece of data. The formulation of a balanced and sparsest generator matrix for RS codes in accordance with various embodiments of the invention is discussed below.

Systems and methods for performing distributed data storage using balanced and sparse RS codes to achieve balanced computational load using portions when only portions of the data set are available in accordance with embodiments of the invention are discussed further below.

Distributed Storage System Architectures

Figure 1C:
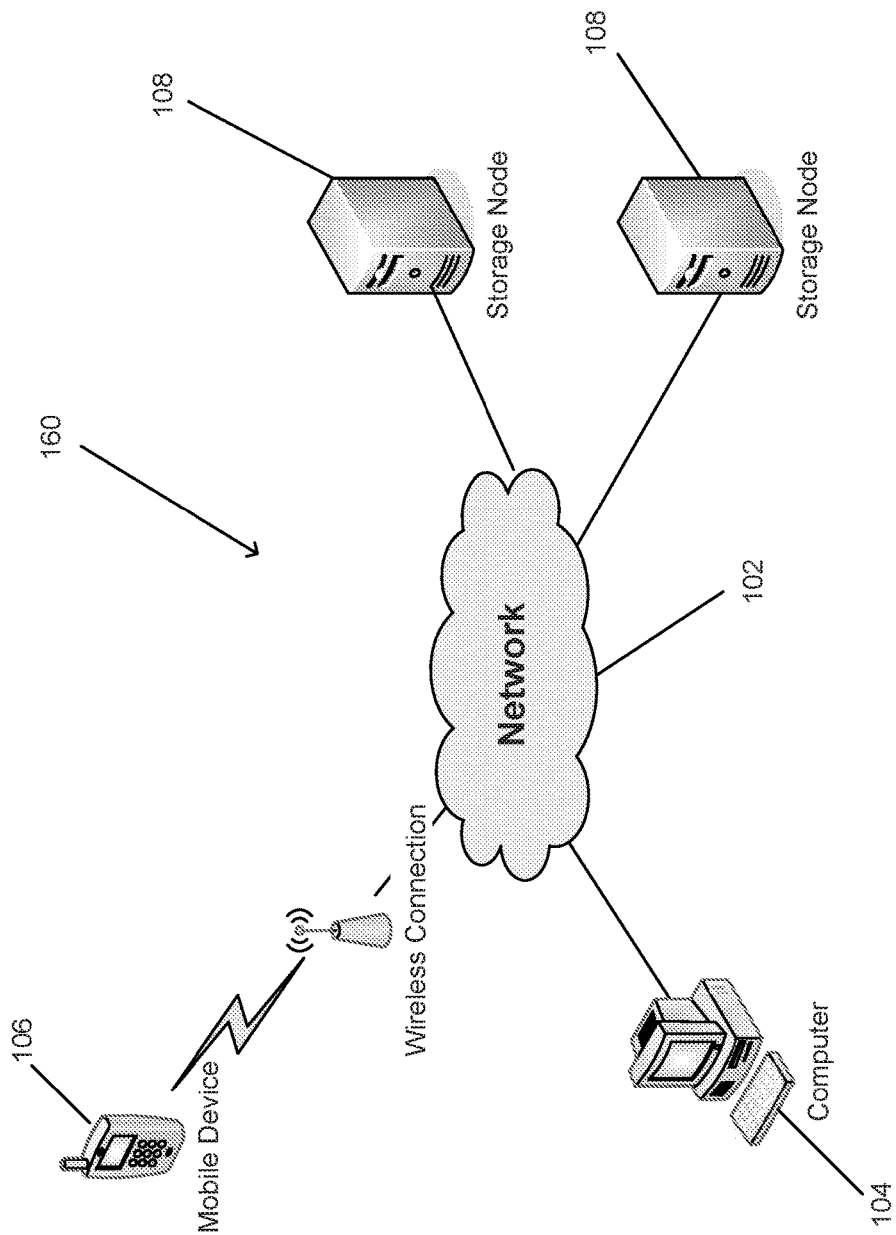
FIG. 1C is a diagram conceptually illustrating a distributed storage system in accordance with an embodiment of the invention.

Distributed storage systems can store data received from devices on nodes. Controllers can facilitate this storage using a variety of processes including Reed-Solomon codes. Turning now to FIG. 1C, a distributed storage system can store data received from devices in accordance with an embodiment of the invention is shown. The system 160 includes communications network 102. The communications network can be connected to one or more centralized computers 104 and one or more mobile devices 106 using a wired and/or wireless connection. The one or more mobile devices can include (but are not limited to) a cellular telephone, a tablet device, and/or a laptop computer. Additionally, the communications network can be connected to one or more nodes 108 in a data storage system. The nodes can be any of a variety of data storage systems including (but not limited to) sectors within an individual disk drive, separate disk drives within a single physical location, separate drives with multiple physical locations, and/or a combination of storage systems. In various embodiments, data can be distributed on a cloud computing system. In some embodiments, nodes can include any of a variety of hard disk drives including (but not limited to) Parallel Advanced Technology Attachment (PATA), Serial ATA (SATA). Small Computer System Interface (SCSI), and/or Solid State Drives (SSD), but should be readily apparent to one having ordinary skill that any memory device can be utilized as appropriate to specific requirements of embodiments of the invention.

One or more centralized computers and/or one or more mobile devices can transmit data to nodes of the data storage system through the communications network. Similarly, the one or more centralized computers and/or one or more mobile devices can retrieve previously transmitted data from nodes of the data storage system through the communications network. Although many systems are described above with reference to FIG. 1C, any of a variety of systems can be utilized to store data in distributed storage nodes in accordance with various embodiments of the invention. Reed-Solomon controllers and node controllers which can control the distribution of data to nodes in a distributed storage system in accordance with many embodiments of the invention are discussed further below.

Figure 2A:
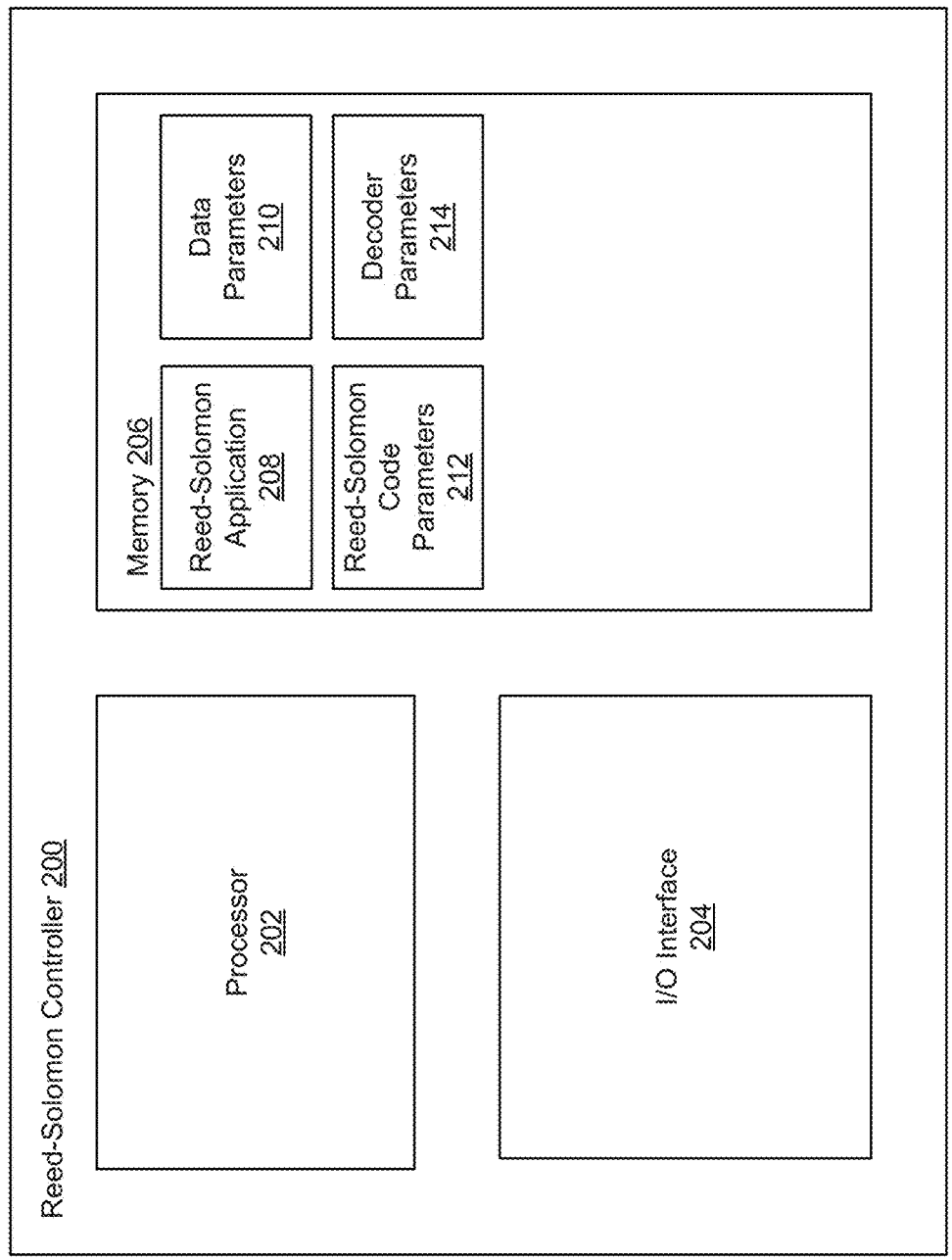
FIG. 2A is a block diagram of a Reed-Solomon controller for use in a distributed storage system in accordance with an embodiment of the invention.

A Reed-Solomon controller in accordance with an embodiment of the invention is shown in FIG. 2A. In many embodiments, the Reed-Solomon controller 200 can perform calculations at a control node to determine which portions of data can be distributed to one or more storage nodes within a distributed storage system. The Reed-Solomon controller can include at least one processor 202, an I/O interface 204, and memory 206. The at least one processor, when configured by software stored in memory, can perform calculations to make changes on data passing through the I/O interface as well as data stored in memory. In many embodiments, the memory 206 can include software including Reed-Solomon application 208 as well as data parameters 210, Reed-Solomon code parameters 212, and decoder parameters 214. Data parameters 210 can include (but are not limited to) any of a variety of information relating to input data including the data itself and/or a registry of nodes in the distributed storage system on which blocks of data are distributed. Reed-Solomon code parameters 212 will be discussed below and can include (but are not limited to) the generator matrix, matrix size, and/or codewords. In several embodiments, Reed-Solomon code parameters can be utilized to determine which node in a distributed storage system will store an individual block of data. Decoding data generally requires accessing blocks of data stored in multiple nodes. Decoder parameters 214 can include (but is not limited to) parameters relating to specific node locations of blocks of data and/or parameters relating to decoders themselves. In many embodiments, known decoders can be utilized including (but not limited to) PetersonGorenstein-Zierler. Berlekamp-Massey, Euclidean, and/or discrete Fourier transforms. It should be readily apparent to one having ordinary skill that decoders can be implemented using (but are not limited to) software implementations, hardware implementations, and/or hybrid software and hardware implementations. The Reed-Solomon application 208 can (but is not limited to) control the distribution of blocks of data to one or more nodes and/or the decoding of requested blocks of data that can be retrieved from one or more nodes.

Figure 2B:
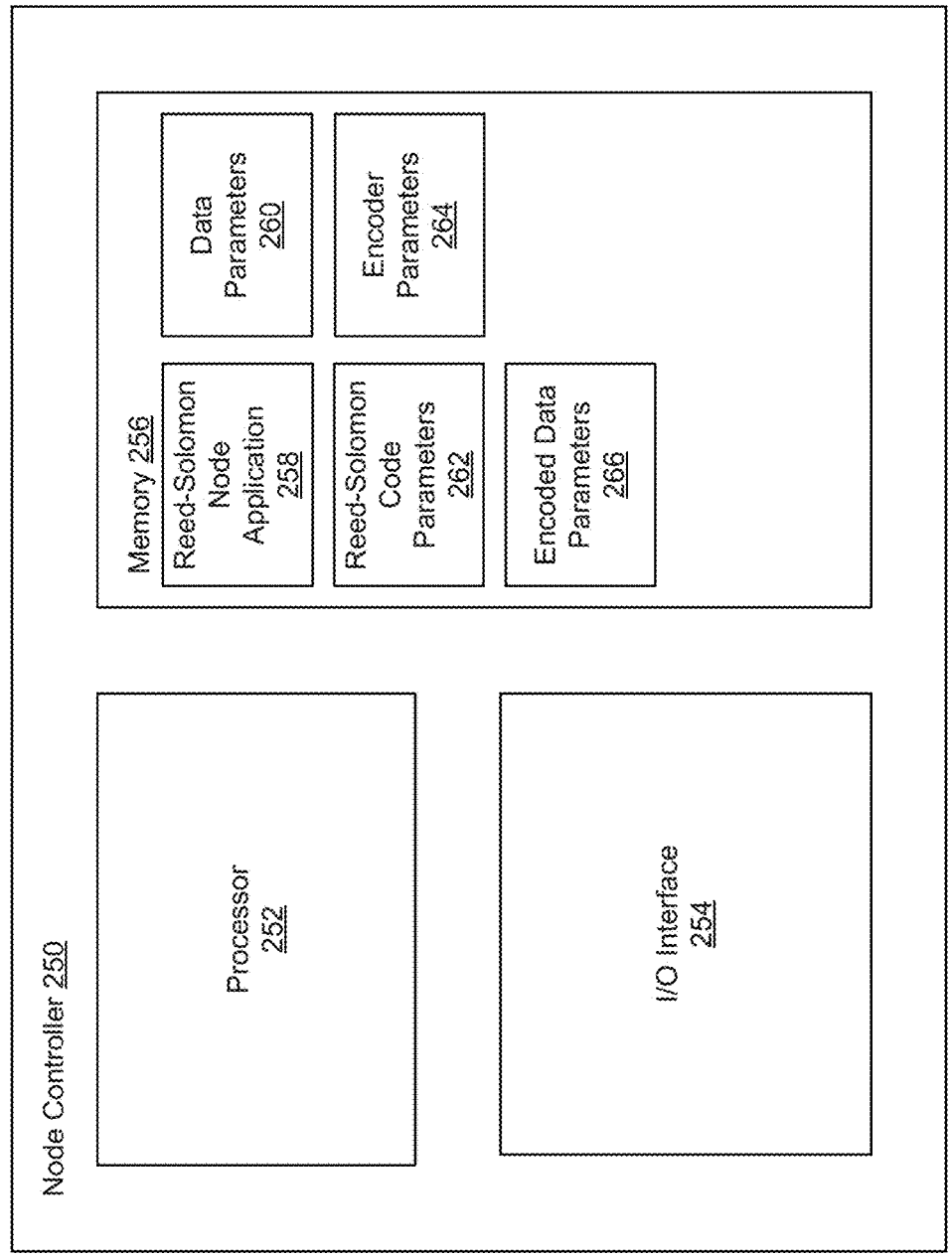
FIG. 2B is a block diagram of a Reed-Solomon node controller for use in a distributed storage system in accordance with an embodiment of the invention.

One or more nodes in the distributed storage system can (but is not limited to) encode, store and/or retrieve stored data in a manner controlled at each individual node by a node controller. A node controller in accordance with an embodiment of the invention is shown in FIG. 2B. In several embodiments, the node controller 250 can encode data blocks distributed to the individual node by a centralized Reed-Solomon controller. The node controller can include at least one processor 252, an I/O interface 254, and memory 256. The at least one processor, when configured by software stored in memory, can encode data blocks received through the I/O interface using balanced and sparsest RS codes. In many embodiments, the memory 256 includes a Reed-Solomon node application 258 as well as data parameters 260, Reed-Solomon code parameters 262, encoder parameters 264, and encoded data parameters 266. Data parameters 260 can include (but are not limited to) any of a variety of information relating to blocks of input data which are generally not the full data set. Reed-Solomon code parameters 262 will be discussed below and can include (but are not limited to) the generator matrix, matrix size, and/or codewords. Encoder parameters 264 can include (but are not limited to) parameters relating to RS code encoding. Encoded data parameters can include (but are not limited to) the encoded data itself and/or additional information a node can store about a block of encoded data. It should be readily apparent to one having ordinary skill that encoders can be implemented using (but are not limited to) software implementations, hardware implementations, and/or hybrid software and hardware implementations. The Reed-Solomon node application 258 will be discussed in greater detail below and can transform blocks of data parameters 260 using a balanced and sparsest generator matrix into encoded data parameters.

Although a number of different Reed-Solomon controllers and node controllers are described above with reference to FIGS. 2A and 2B, any of a variety of computing systems can be utilized to control the distribution of data blocks to nodes and the encoding of those data blocks within a distributed storage system as appropriate to the requirements of specific applications in accordance with various embodiments of the invention. Balanced Reed-Solomon processes in accordance with many embodiments of the invention are discussed below.

Balanced Reed-Solomon Processes

Figure 3:
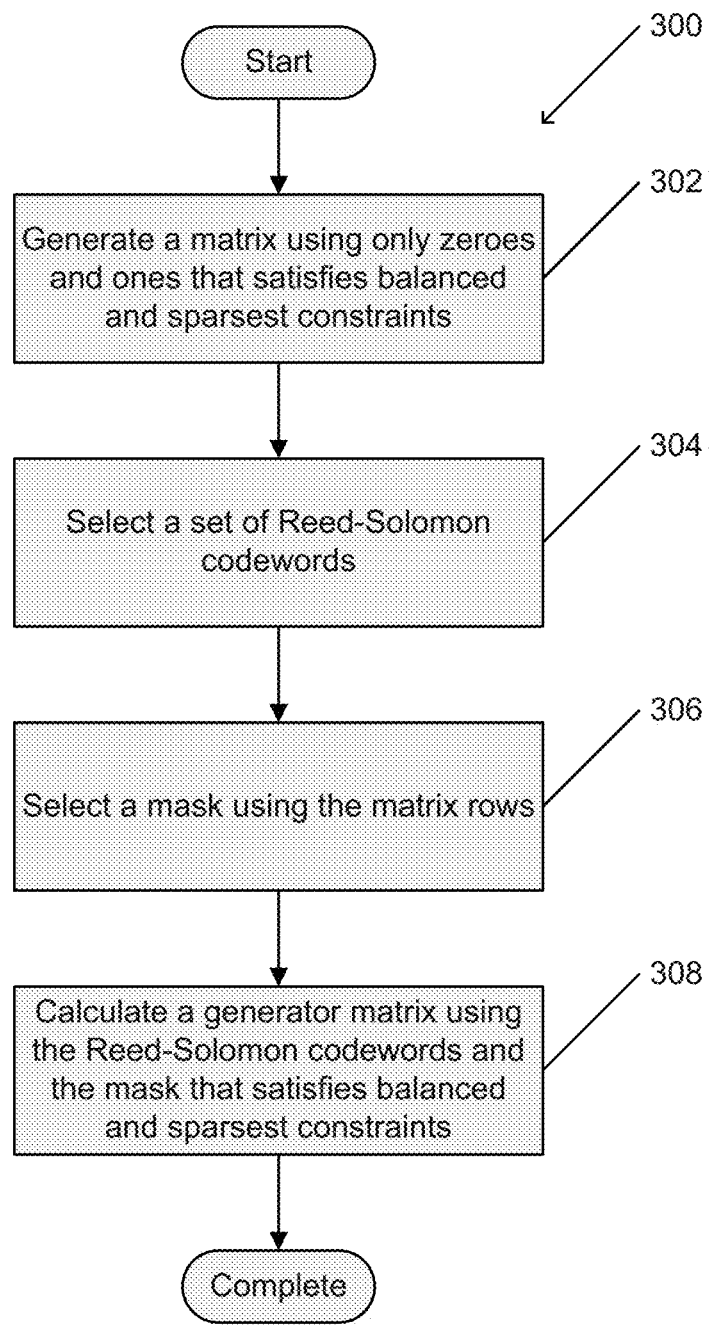
FIG. 3 is a flowchart illustrating a process to construct a generator matrix for a balanced Reed-Solomon code in accordance with an embodiment of the invention.

Balanced Reed-Solomon processes can construct generator matrices for use in balanced Reed-Solomon codes. Turning now to FIG. 3, a process for constructing a generator matrix satisfying balanced and sparsest constraints in accordance with an embodiment of the invention is illustrated. The process 300 includes generating (302) a matrix using only zeroes and ones that satisfies balanced and sparsest constraints. Mathematical details of balanced and sparsest constraints will be discussed in detail below. A set of Reed-Solomon codewords can be selected (304). A mask can be selected (306) using the rows of the matrix that satisfies the balanced and sparsest constraints. A Reed-Solomon generator matrix can be calculated (308) using the Reed-Solomon codewords and the mask. In many embodiments, a generator matrix calculated using this process will also satisfy the balanced and sparsest constraints. Generator matrices can be utilized to encode data in accordance with many embodiments of the invention. Several applications include encoding data for use in distributed storage systems. Although an overview process for constructing generator matrices for balanced Reed-Solomon codes is described above with reference to FIG. 3, any of a variety of processes for constructing generator matrices that satisfy balanced and sparsest constraints can be utilized as appropriate to the requirements of specific applications in accordance with various embodiments of the invention. Mathematical details regarding the construction of generator matrices in accordance with several embodiments of the invention are discussed further below.

Constructing Balanced Reed-Solomon Generator Matrices

Consider a group of n storage nodes that jointly encode a message vector $m \in \mathbb{F}_q^k$ using an error-correcting code $\mathcal{C}$, with generator matrix $G \in \mathbb{F}_q^{k \times n}$. In particular, every storage node $S_i$ encodes the message symbols using $g_i$, the $i^{th}$ column of G, to produce a code symbol $c_i$. The time required to compute $c_i$ is a function of the weight—the number of nonzero entries—of $g_i$. If $\mathcal{C}$ is chosen as a Maximum Distance Separable (MDS) code, it can be argued the average encoding time, over the $S_i$'s, is minimized by using a systematic G. If the maximal encoding time can be considered, then systematic encoding is as slow as using a generator matrix that has no zeros.

In many embodiments of the invention, a solution lives between these two extremes. Balanced generator matrices can be considered in which the rows of the generator matrix G have fixed, but tunable, weight and the columns have essentially the same weight. The benefit of a balanced generator matrix G is that every code symbol $c_i$ is computed in roughly the same amount of time. This enables the computational load to be balanced across the storage system. i.e. there are no storage nodes that behave as bottlenecks. Furthermore, if each row of G can be fixed to have weight s, then updating a single message symbol generally impacts exactly w storage nodes. When w=d, where d is the minimum distance of the code, a balanced and sparsest generator matrix can be obtained. For G to be balanced, the weight of each column has to be either $$\left\lfloor \frac{wk}{n} \right\rfloor \text{ or } \left\lceil \frac{wk}{n} \right\rceil.$$

This is seen from the fact the total number of nonzeros in G is kw, which is to be distributed equally among the n columns.

In several embodiments, a balanced matrix can be defined: A matrix A of size k by n is called w-balanced if the following conditions hold: P(1) Every row of A has the same weight w. P(2) Every column is of weight $$\left\lceil \frac{wk}{n} \right\rceil \text{ or } \left\lfloor \frac{wk}{n} \right\rfloor.$$

It is clear that P(2) is equivalent to having the columns differ in weight by at most one. In many embodiments a w-balanced generator matrix for a given cyclic Reed-Solomon code can be shown. In particular, each row is a codeword of weight w, such that d≤w≤n−1.

The allowed value of w is used to specify the sparsity of the target generator matrix, while the results for denser generator matrices are only of theoretical interest, the proof techniques could be of potential use when one is interested in enforcing different types of structure.

Reed-Solomon Codes

In many embodiments, a Reed-Solomon code can be defined as the k-dimensional subspace of $\mathbb{F}_q^n$ given by $$RS[n,k]_q = \{(m(\alpha_1), \ldots, m(\alpha_n)) : \deg(m(x)) < k\}, \quad (1)$$

where m(x) is a polynomial over $\mathbb{F}_q$ of degree deg(m(x)), and the $\alpha \in \mathbb{F}_q$ are distinct (fixed) field elements. Each message vector $m = (m_0, \ldots, m_{k-1}) \in \mathbb{F}_q^k$ is mapped to a message polynomial $m(x) = \sum_{i=0}^{k-1} m_i x^i$, which is then evaluated at the n distinct elements $\{\alpha_1, \alpha_2, \ldots, \alpha_n\}$ of $\mathbb{F}_q$, known as the defining set of the code. The codeword associated with m(x) is $c = (m(\alpha_1), \ldots, m(\alpha_n))$, which can be frequently referred to as the evaluation of m(x) at $\{\alpha_1, \alpha_2, \ldots, \alpha_n\}$. Reed-Solomon codes are MDS codes; their minimum distance attains the Singleton bound, i.e., $d(RS[n,k]_q) = n-k+1$.

Unless otherwise stated, Reed-Solomon codes are considered to be cyclic, whose defining set is chosen as $\{1, \alpha, \ldots, \alpha^{n-1}\}$, where $\alpha$ is a primitive element in $\mathbb{F}_q$. A generator matrix for this code is given by $$G_{RS} = \begin{bmatrix} 1 & 1 & \ldots & 1 \\ 1 & \alpha & \ldots & \alpha^{n-1} \\ \vdots & \vdots & \ddots & \vdots \\ 1 & \alpha^{(k-1)} & \ldots & \alpha^{(n-1)(k-1)} \end{bmatrix}. \quad (2)$$

Viewing Reed-Solomon codes through the lens of polynomials allows codewords to be easily characterized with a prescribed set of coordinates required to be equal to 0. It is known that if a degree k−1 polynomial t(x) that vanishes on a prescribed set of k−1 points is interpolated, then t(x) is unique up to multiplication by a scalar. Suppose a minimum weight codeword c∈RS[n,k] is specified for which $c_{i_0} = c_{i_{k-2}}$. Let $t(x) = \Pi_{j=0}^{k-1}(x-\alpha^{i_j}) = t_i x^i$, and form the vector of coefficients of t(x) as $t = (t_0, t_1, \ldots, t_{k-1})$. The codeword resulting from encoding of t using $G_{RS}$ is a codeword c with zeros in the desired coordinates. Indeed, $tG_{RS}$ is the evaluation of the polynomial t(x) at $\{1, \alpha, \ldots, \alpha^{n-1}\}$. Since t(x) has $\{\alpha^{i_1}, \ldots, \alpha^{i_l}\}$ as roots, it follows that $[tG_{RS}]_{i_1} = \ldots = [tG_{RS}]_{i_l} = 0$. This correspondence between codewords and polynomials will allow the focus to be on the latter when constructing generator matrices with the prescribed structure.

The particular form of t(x), in particular the number of nonzero coefficients, will be used frequently in the various parts of this work. BCH bound can be used to provide this information. BCH bound: Let p(x) be a nonzero polynomial (not divisible by $x^{q-1}-1$) with coefficients in $\mathbb{F}_q$. Suppose p(x) has t (cyclically) consecutive roots, i.e. $p(\alpha^{j+1}) = \ldots = p(\alpha^{j+t}) = 0$, where $\alpha$ is primitive in $\mathbb{F}_q$. Then at least t+1 coefficients of p(x) are nonzero. The BCH bound ensures that all the coefficients of a degree t polynomial with exactly t consecutive roots are nonzero.

Construction of w-Balanced Matrices

This section includes a method that produces a w-balanced matrix in accordance with many embodiments of the invention. Then, it will be shown how this scheme enables the construction of a w-balanced generator matrix for Reed-Solomon codes.

A w-balanced error-correcting code is one that is generated by a matrix obeying the properties of P(1) and P(2) described above. It can be emphasized that not any w-balanced matrix can serve as a mask for a target generator matrix. Suppose that for a choice of parameters k, w and n, an embodiment has n|wk. In this case, one can take $A \in \{0,1\}^{k \times n}$ as the adjacency matrix of a $$\left( w, \frac{wk}{n} \right)$$

biregular bipartite graph on k left vertices and n right vertices. The following example can demonstrate why this approach could lead to a bad choice. Let n=8, k=5 and w=4, where we are interested in finding a balanced generator matrix for RS [8, 5]. One possible realization of of a matrix A that obeys the conditions of P(1) and P(2) is $$A = \begin{bmatrix} 1 & 1 & 1 & 1 & 0 & 0 & 0 & 0 \\ 0 & 0 & 0 & 0 & 1 & 1 & 1 & 1 \\ 1 & 1 & 1 & 1 & 0 & 0 & 0 & 0 \\ 0 & 0 & 0 & 0 & 1 & 1 & 1 & 1 \\ 1 & 1 & 1 & 1 & 0 & 0 & 0 & 0 \end{bmatrix}. \quad (3)$$

Note that the first and last rows are identical, and are of weight 4, which is the minimum distance of RS[8,5]. As alluded to earlier, any two codewords of minimum weight with the same support are scalar multiples of one another. This immediately rules out the possibility of A serving as a mask for a generator matrix of RS[8,5]. Indeed, the distinctness of the rows of A is necessary in this case.

Having shown the necessity of carefully constructing a mask matrix for the sought after generator matrix, the first contribution of this work is to provide a simple process that does this. When the code of interest is RS [n, k], a construction of a w-balanced generator matrix can be presented where n−k+1≤w≤n−1.

Let a be a vector of length n comprised of w consecutive ones followed by n−w consecutive zeros, i.e. a=(1, . . . , 1, 0, . . . 0). In addition, let $a_j$ denote the right cyclic shift of a by j positions. In several embodiments, a shift by $j \geq n$ is equivalent to one where j is taken modulo n. To simplify notation. $(x)_n$ can be used to refer to the x mod n. Furthermore, this notation can be extended to sets by letting $\{x_1, \ldots, x_l\}_n$ denote $\{(x_1)_n, \ldots, (x_l)_n\}$. For example, if n=8 and w=4, then $a_6=(1,1,0,0,0,0,1,1)$. Roughly speaking, the desired matrix A is built by setting its first row to a and then choosing the next row by cyclically shifting a by w positions to the right. As mentioned earlier, duplicate rows in A are to be avoided, and the way to do so is formalized below. Let both k and w be strictly less than n. Define the quantities $$g := gcd(w, n), \eta := \frac{n}{g}, \varphi = \left\lfloor \frac{k}{\eta} \right\rfloor \text{ and } \rho = k - \eta\varphi.$$

Define the index sets $$\mathcal{J}_1 = \{jw+i : 0 \leq j \leq \eta-1, 0 \leq i \leq \varphi-1\}$$

$$\mathcal{J}_2 = \{jw+\varphi : 0 \leq j \leq \rho-1\},$$

and $\mathcal{J} = \mathcal{J}_1 \cup \mathcal{J}_2$. The matrix A whose rows are given by $$\{a_l : l \in \mathcal{J}\}.$$

satisfies P(1) and P(2). Furthermore, the rows of A are pairwise distinct.

The nature of the construction allows us to identify the columns that are of weight $$\left\lceil \frac{wk}{n} \right\rceil.$$

The columns of A as obtained above with weight $$\left\lceil \frac{wk}{n} \right\rceil$$

are those indexed by $$\mathcal{H} = \{\varphi, \varphi+1, \ldots, \varphi+wk-1\}_n,$$

where $$\varphi = \left\lfloor \frac{k}{n} gcd(w, n) \right\rfloor.$$

Additionally, the construction above provides a remedy to the matrix in (3). Let n=8, k=5 and w=4. The 4-balanced matrix A is $$A = \begin{bmatrix} 1 & 1 & 1 & 1 & 0 & 0 & 0 & 0 \\ 0 & 0 & 0 & 0 & 1 & 1 & 1 & 1 \\ 0 & 1 & 1 & 1 & 1 & 0 & 0 & 0 \\ 1 & 0 & 0 & 0 & 0 & 1 & 1 & 1 \\ 0 & 0 & 1 & 1 & 1 & 1 & 0 & 0 \end{bmatrix}. \quad (4)$$

The parameters are g=4, $\eta$=2, $\varphi$=2 and $\rho$=1. The index sets are given by $\mathcal{J}_1=\{0,4,1,5\}$ and $\mathcal{J}_2=\{2\}$. It turns out that this matrix can serve as a mask matrix for a 4-balanced generator matrix of RS[8,5] defined over $\mathbb{F}_9$. The rows are taken as the evaluations of the following polynomials on $\{1, \alpha, \ldots, \alpha^8\}$, where $\alpha$ generates $\mathbb{F}_9^x$.

$$p^{(0)}(x) = \prod_{i=4}^{7} (x - \alpha^i),$$

$$p^{(4)}(x) = 2\prod_{i=4}^{7} (x - \alpha^{i+4}),$$

$$p^{(1)}(x) = \prod_{i=4}^{7} (x - \alpha^{i+1}),$$

$$p^{(5)}(x) = 2\prod_{i=4}^{7} (x - \alpha^{i+5}),$$

$$p^{(2)}(x) = \prod_{i=4}^{7} (x - \alpha^{i+2}).$$

The resulting 4-balanced generator matrix is given by $$G = \begin{bmatrix} \alpha^3 & \alpha^2 & \alpha^4 & \alpha & 0 & 0 & 0 & 0 \\ 0 & 0 & 0 & 0 & \alpha^3 & \alpha^2 & \alpha^4 & \alpha \\ 0 & \alpha^3 & \alpha^2 & \alpha^4 & \alpha & 0 & 0 & 0 \\ \alpha & 0 & 0 & 0 & 0 & \alpha^3 & \alpha^2 & \alpha^4 \\ 0 & 0 & \alpha^3 & \alpha^2 & \alpha^4 & \alpha & 0 & 0 \end{bmatrix}.$$

One can check that G is full rank over $\mathbb{F}_9$ for $\alpha$ whose minimal polynomial over $\mathbb{F}_3$ is $x^2+2x+2$. The way the evaluation polynomials can be chosen is determined by the set $\mathcal{J}$ from the construction above.

Balanced Reed-Solomon Codes

In several embodiments, codewords can be selected for the Reed-Solomon generating matrix. $p(x) = \Pi_{i=4}^{7}(x-\alpha^i)$ can be fixed. The set of polynomials can be formed:

$$\mathcal{P} = \{p(\alpha^{j_l} x) : j_l \in \mathcal{J}\} \quad (5)$$

Now consider corresponding to an arbitrary $j_l \in \mathcal{J}$. This polynomial can be expressed as $$p(\alpha^{-j_l} x) = \prod_{i=4}^{7} (\alpha^{-j_l} x - \alpha^i) = \alpha^{-4j_l} \prod_{i=4}^{7} (x - \alpha^{i+j_l}).$$

When evaluated on $\{1, \alpha, \ldots, \alpha^8\}$, this polynomial vanishes on and only on $\{\alpha^{4+j_l}, \ldots, \alpha^{7+j_l}\}$. The polynomial $p(\alpha^{-1}x)$ is the annihilator of $\alpha^{l+d}, \ldots, \alpha^{l+n-1}$ if and only if p(x) is the annihilator of $\alpha^d, \ldots, \alpha^{n-1}$.

Thus, the coordinates of the corresponding codeword that are equal to 0 are precisely those indexed by $\{4+j_l \ldots 7+j_l\}_n$, which is in agreement with $a_{j_l}$. Hence, the codewords corresponding to the polynomials in (5) form a 4-balanced generator matrix whose support is determined by A in (4). In various embodiments, these polynomials are linearly independent over the underlying field if and only if the elements of $\mathcal{J}$ are pairwise distinct and w=n−k+1. Let $p(x) = \Sigma_{i=0}^{z} p_i x^i \in \mathbb{F}_q[x]$ and define $\mathcal{P} = \{p(\alpha^{j_l} x)\}_{l=0}^{z}$. The polynomials in $\mathcal{P}$ are linearly independent over $\mathbb{F}_q$ if and only if the elements of $\{\alpha^{j_l}\}_{l=0}^{z}$ are distinct in $\mathbb{F}_q$, and $p_i \neq 0$ for i=0, 1 ..., z.

In several embodiments, this can provide a tool for constructing d-balanced Reed-Solomon codes, where d is the minimum distance of RS[n,k]. In general, it can give conditions for which a set of z+1 codewords constructed from the same polynomial of degree z are linearly independent: For d=n−k+1, let A be a d-balanced matrix obtained above with index set $\mathcal{J}$. Fix $p(x)=\Pi_{i=d}^{n-1}(x-\alpha^i)$ and let $\mathcal{P}=\{p(\alpha^{-j_l}x):j_l\in\mathcal{J}\}$. Then, the matrix G whose $l^{th}$ row is the codeword corresponding to $p(\alpha^{-j_l}x)$ is a d-balanced generator matrix for RS[n,k]. In several embodiments, this can provide a process to construct what is known as sparsest and balanced Reed-Solomon codes. They are sparsest in the sense that each row of the generator matrix is a minimum distance codeword.

Now suppose that for the same code RS[8, 5], a 6-balanced generator matrix is of interest. In several embodiments, the case when the desired row weight need not be d is attainable with little effort.

Balanced RS codes: For $n-k+1 \leq w \leq n-1$, let A be a w-balanced matrix obtained above with index set $\mathcal{J}=\{i_0,\ldots,i_{k-1}\}$. Fix $p(x)=\Pi_{i=w}^{n-1}(x-\alpha^i)$ and let $\mathcal{P}_1=\{p(\alpha^{-j_l}x):l=0,1,\ldots,n-w\}$ $\mathcal{P}_2=\{x^{l-n+w}p(\alpha^{-j_l}x):l=n-w+1,\ldots k-1\}$ Then, the matrix G whose $l^h$ row is the codeword corresponding to $p(\alpha^{-j_l}x)$ is a w-balanced generator matrix for RS[n, k].

It is possible to verify that the following matrix does indeed generate RS[8,5].

$$G=\begin{bmatrix} \alpha^5 & \alpha^3 & \alpha^2 & \alpha^3 & \alpha^6 & \alpha^2 & 0 & 0 \\ \alpha^2 & \alpha^3 & \alpha^6 & \alpha^2 & 0 & 0 & \alpha^5 & \alpha^3 \\ \alpha^6 & \alpha^2 & 0 & 0 & \alpha^5 & \alpha^3 & \alpha^2 & \alpha^3 \\ 0 & 0 & \alpha^7 & \alpha^6 & \alpha^6 & 1 & \alpha^4 & \alpha \\ 0 & \alpha^7 & \alpha^7 & \alpha^8 & \alpha^3 & 1 & \alpha^6 & 0 \end{bmatrix}$$

The matrix G corresponds to the index set $\mathcal{J}=\{0,6,4,2,1\}$. The polynomials corresponding to the rows of G are derived from $p(x)=(x-\alpha^6)(x-\alpha^7)$, and are given by $p^{(0)}(x)=(x-\alpha^6)(x-\alpha^7)$, $p^{(6)}(x)=\alpha^{-4}(x-\alpha^4)(x-\alpha^5)$, $p^{(4)}(x)=(x-\alpha^2)(x-\alpha^3)$, $p^{(2)}(x)=\alpha^{-4}x(x-1)(x-\alpha)$, $p^{(1)}(x)=\alpha^{-2}x^2(x-\alpha)(x-\alpha^7)$.

The fact that high weight codewords are of interest helped to ensure that G is full rank. The codewords chosen correspond to low degree polynomials, which allows one to use the extra degrees of freedom available in constructing the set $\mathcal{P}_2$. In fact, one can select $\mathcal{P}_2$ as any set of polynomials whose degrees are all different, and are between $n-w+1$ and $k-1$. This will generally guarantee that the resulting generator matrix is full rank albeit not w-balanced. Nonetheless, one can potentially use this technique to enforce other patterns in the structure of G.

In some embodiments, Balanced Reed-Solomon processes can provide a framework for constructing balanced and sparsest generator matrices for error-correcting codes. The fact that each row of G is of minimal weight can imply that when a single message symbol is updated, the least number of code symbols possible need to be modified. This feature can be appealing in the context of distributed storage systems since the number of storage nodes contacted during an update is minimal. As discussed, the balanced property ensures that all storage nodes finish computing their respective code symbols in the same amount of time.

A natural question to ask is whether one can construct a generator matrix that is balanced in the row sense. More precisely, suppose $2 \leq w \leq k$ can be fixed as the desired column weight of a generator matrix $G\in\mathbb{F}_q^{k\times n}$ the constraint that any two rows of G differ in weight by at most 1 can be enforced. Can G be realized as the generator matrix of some k-dimensional subcode of a Reed-Solomon code? The two requirements imply that each row is of weight equal to $$\left\lceil\frac{wn}{k}\right\rceil \text{ or } \left\lfloor\frac{wn}{k}\right\rfloor.$$

In some cases, the techniques in accordance with several embodiments of the invention can be used to construct such generator matrices. In particular, if $$\frac{wn}{k}$$

$\in\mathbb{Z}$ and $$k \geq n - \frac{wn}{k}+1,$$

processes described above can be used to produce the required mask matrix. Now if $$k < n - \frac{wn}{k}+1,$$

one needs to resort to a larger RS code, namely $$RS\left[n, n-\frac{wn}{k}+1\right].$$

Balanced Reed-Solomon Codes for Distributed Storage Processes

In many embodiments, a distributed storage process can encode blocks of data at one or more individual nodes in a distributed storage system. The process can include receiving a block of data at an individual node from a centralized coordinator. This block of data generally is smaller than the entire data set. In several embodiments, each node in the distributed storage system can receive blocks of data that are the same size. A node can encode a data block using a balanced Reed-Solomon encoder with a generator matrix that satisfies balanced and sparsest constraints. By distributing blocks of data of equal size to each node in the distributed storage system, the write commands generally can be load balanced.

The centralized controller can receive a signal requesting stored data. In some embodiments, the centralized controller can determine the location of the individual blocks of the stored data, which can be located at one or more nodes. The location of individual blocks of data can be stored in a variety of ways including (but not limited to) in an index accessible by the centralized controller. A signal can be sent to each node where α block of the data is stored. The centralized decoder can decode the blocks of data and transmit the requested data to the user. It should be readily appreciated by one having ordinary skill that the encoding and/or decoding process described above is merely illustrative and any of a variety of processes using balanced and sparsest Reed-Solomon generator matrices to store blocks of data in one more nodes of a distributed storage system can be utilized as appropriate to various requirements of embodiments of the invention.

Balanced Reed-Solomon Code Illustrative Examples

Illustrative examples of generator matrices of balanced RS codes in accordance with many embodiments of the invention are discussed below.

In several embodiments, the following generator matrix is for a balanced RS code with parameters [6,4] defined over $\mathbb{F}_5$.

$$G = \begin{bmatrix} 3 & 1 & 4 & 0 & 0 & 0 \\ 0 & 0 & 0 & 3 & 1 & 4 \\ 0 & 3 & 1 & 4 & 0 & 0 \\ 4 & 0 & 0 & 0 & 3 & 1 \end{bmatrix}.$$

The computational effort is distributed across the disks so that no bottlenecks are present in the system. The benefit of balanced RS codes is more apparent when the parameters grow. Unlike traditional RAID-6 configurations, a column of the generator matrix of a two erasure-correcting balanced RS code will always be of weight two or three. For the practically-appealing finite field $\mathbb{F}_{2^8}$, this implies that one can construct a balanced generator matrix for a RS code with parameters [255,253], without any degradation in computational performance.

Additionally, in various embodiments, the following generator matrix is for a balanced RS code with parameters [15, 13] defined over $\mathbb{F}_{2^4}$. The underlying finite field allows one to operate on a granularity of half-a-byte.

$$G = \begin{bmatrix} \alpha^3 & \alpha^5 & 1 & 0 & 0 & 0 & 0 & 0 & 0 & 0 & 0 & 0 & 0 & 0 & 0 \\ 0 & 0 & 0 & \alpha^3 & \alpha^5 & 1 & 0 & 0 & 0 & 0 & 0 & 0 & 0 & 0 & 0 \\ 0 & 0 & 0 & 0 & 0 & 0 & \alpha^3 & \alpha^5 & 1 & 0 & 0 & 0 & 0 & 0 & 0 \\ 0 & 0 & 0 & 0 & 0 & 0 & 0 & 0 & 0 & \alpha^3 & \alpha^5 & 1 & 0 & 0 & 0 \\ 0 & 0 & 0 & 0 & 0 & 0 & 0 & 0 & 0 & 0 & 0 & 0 & \alpha^3 & \alpha^5 & 1 \\ 0 & \alpha^3 & \alpha^5 & 1 & 0 & 0 & 0 & 0 & 0 & 0 & 0 & 0 & 0 & 0 & 0 \\ 0 & 0 & 0 & 0 & \alpha^3 & \alpha^5 & 1 & 0 & 0 & 0 & 0 & 0 & 0 & 0 & 0 \\ 0 & 0 & 0 & 0 & 0 & 0 & 0 & \alpha^3 & \alpha^5 & 1 & 0 & 0 & 0 & 0 & 0 \\ 0 & 0 & 0 & 0 & 0 & 0 & 0 & 0 & 0 & 0 & \alpha^3 & \alpha^5 & 1 & 0 & 0 \\ 1 & 0 & 0 & 0 & 0 & 0 & 0 & 0 & 0 & 0 & 0 & 0 & 0 & \alpha^3 & \alpha^5 \\ 0 & 0 & \alpha^3 & \alpha^5 & 1 & 0 & 0 & 0 & 0 & 0 & 0 & 0 & 0 & 0 & 0 \\ 0 & 0 & 0 & 0 & 0 & \alpha^3 & \alpha^5 & 1 & 0 & 0 & 0 & 0 & 0 & 0 & 0 \\ 0 & 0 & 0 & 0 & 0 & 0 & 0 & 0 & \alpha^3 & \alpha^5 & 1 & 0 & 0 & 0 & 0 \end{bmatrix}$$

A [14, 10] RS code can be used to protect data in a large distributed storage system. A balanced generator matrix of an RS code with parameters [15, 10] can be used a as surrogate to build a one for a code with parameters [14, 10]. In the following two generator matrices, the element α is primitive in $\mathbb{F}_{2^4}$.

$$G_{15,10} = \begin{bmatrix} \alpha^8 & \alpha^9 & \alpha^{13} & \alpha^{10} & 1 & \alpha^8 & 0 & 0 & 0 & 0 & 0 & 0 & 0 & 0 & 0 \\ 0 & 0 & 0 & 0 & 0 & 0 & \alpha^8 & \alpha^9 & \alpha^{13} & \alpha^{10} & 1 & \alpha^8 & 0 & 0 & 0 \\ \alpha^{10} & 1 & \alpha^8 & 0 & 0 & 0 & 0 & 0 & 0 & 0 & 0 & \alpha^8 & \alpha^9 & \alpha^{13} \\ 0 & 0 & 0 & \alpha^8 & \alpha^9 & \alpha^{13} & \alpha^{10} & 1 & \alpha^8 & 0 & 0 & 0 & 0 & 0 & 0 \\ 0 & 0 & 0 & 0 & 0 & 0 & 0 & 0 & 0 & \alpha^8 & \alpha^9 & \alpha^{13} & \alpha^{10} & 1 & \alpha^8 \\ 0 & \alpha^8 & \alpha^9 & \alpha^{13} & \alpha^{10} & 1 & \alpha^8 & 0 & 0 & 0 & 0 & 0 & 0 & 0 & 0 \\ 0 & 0 & 0 & 0 & 0 & 0 & 0 & \alpha^8 & \alpha^9 & \alpha^{13} & \alpha^{10} & 1 & \alpha^8 & 0 & 0 \\ \alpha^{13} & \alpha^{10} & 1 & \alpha^8 & 0 & 0 & 0 & 0 & 0 & 0 & 0 & 0 & 0 & \alpha^8 & \alpha^9 \\ 0 & 0 & 0 & 0 & \alpha^8 & \alpha^9 & \alpha^{13} & \alpha^{10} & 1 & \alpha^8 & 0 & 0 & 0 & 0 & 0 \\ \alpha^8 & 0 & 0 & 0 & 0 & 0 & 0 & 0 & 0 & \alpha^8 & \alpha^9 & \alpha^{13} & \alpha^{10} & 1 \end{bmatrix}.$$

Through a puncturing argument, the previous generator matrix can be converted to one for a [14, 10] code with optimal error-correcting capabilities. For example, eliminating the last column results in such a generator matrix. It should be noted that puncturing results in rows which are of slightly varying weights, although this has no effect on the computational effort exerted by each disk.

$$G_{14,10} = \begin{bmatrix} \alpha^8 & \alpha^9 & \alpha^{13} & \alpha^{10} & 1 & \alpha^8 & 0 & 0 & 0 & 0 & 0 & 0 & 0 & 0 \\ 0 & 0 & 0 & 0 & 0 & 0 & \alpha^8 & \alpha^9 & \alpha^{13} & \alpha^{10} & 1 & \alpha^8 & 0 & 0 \\ \alpha^{10} & 1 & \alpha^8 & 0 & 0 & 0 & 0 & 0 & 0 & 0 & 0 & \alpha^8 & \alpha^9 \\ 0 & 0 & 0 & \alpha^8 & \alpha^9 & \alpha^{13} & \alpha^{10} & 1 & \alpha^8 & 0 & 0 & 0 & 0 & 0 \\ 0 & 0 & 0 & 0 & 0 & 0 & 0 & 0 & 0 & \alpha^8 & \alpha^9 & \alpha^{13} & \alpha^{10} & 1 \\ 0 & \alpha^8 & \alpha^9 & \alpha^{13} & \alpha^{10} & 1 & \alpha^8 & 0 & 0 & 0 & 0 & 0 & 0 & 0 \\ 0 & 0 & 0 & 0 & 0 & 0 & 0 & \alpha^8 & \alpha^9 & \alpha^{13} & \alpha^{10} & 1 & \alpha^8 & 0 \\ \alpha^{13} & \alpha^{10} & 1 & \alpha^8 & 0 & 0 & 0 & 0 & 0 & 0 & 0 & 0 & 0 & \alpha^8 \\ 0 & 0 & 0 & 0 & \alpha^8 & \alpha^9 & \alpha^{13} & \alpha^{10} & 1 & \alpha^8 & 0 & 0 & 0 & 0 \\ \alpha^8 & 0 & 0 & 0 & 0 & 0 & 0 & 0 & 0 & \alpha^8 & \alpha^9 & \alpha^{13} & \alpha^{10} \end{bmatrix}$$

It should be readily appreciated by one having ordinary skill that [6,4] and [14,10] RS codes are merely illustrative examples and any of a variety of RS codes can be constructed as appropriate to specific requirements of many embodiments of the invention.

Additional Balanced RS Code Processes

Balanced RS codes can be utilized by machine learning processes in accordance with many embodiments of the invention. A centralized controller can distribute big machine learning computations to machines. Balanced and sparsest RS codes can be utilized such that the distribution can generally be load balanced. In several embodiments, balanced RS codes can be used to compensate for machines that have not yet reported back with calculations by treating them as erasures. It should be readily apparent to one having ordinary skill how to adapt methods and processes described above to calculate the missing machine learning data using balanced RS codes in accordance with many embodiments of the invention.

Additionally, balanced RS codes in accordance with many embodiments of the invention can be used with MapReduce processes. Balanced RS codes can be used as an addon to the parallel distribution to generate big data sets generally found in MapReduce processes. In several embodiments, if a machine is slow to return data, that machine can be treated as an erasure and a balanced RS code process can be used to construct the data.

Although the present invention has been described in certain specific aspects, many additional modifications and variations would be apparent to those skilled in the art. In particular, any of the various processes described above can be performed in alternative sequences and/or in parallel (on the same or on different computing devices) in order to achieve similar results in a manner that is more appropriate to the requirements of a specific application. It is therefore to be understood that the present invention can be practices otherwise than specifically described without departing from the scope and spirit of the present invention. Thus, embodiments of the present invention should be considered in all respects as illustrative and not restrictive. It will be evident to the person skilled in the art to freely combine several or all of the embodiments discussed here as deemed suitable for a specific application of the invention. Throughout this disclosure, terms like "advantageous,", "exemplary", or "preferred" indicate elements or dimensions which are particularly suitable (but not essential) to the invention or an embodiment thereof, and may be modified wherever deemed suitable by the skilled person, except where expressly required. Accordingly, the scope of the invention should be determined not by the embodiments illustrated, but by the appended claims and their equivalents.

What is claimed is:

1. A distributed storage system comprising:
a plurality of distributed storage nodes configured to store a data file recoverable from a subset of the plurality of distributed storage nodes, wherein each distributed storage node comprises:
a network interface;
a processor;
a memory containing:
a Reed-Solomon node application;
wherein the processor is configured by the Reed-Solomon node application to:
receive a block of data using the network interface;
encode the block of data using a balanced and sparsest error-correcting code; and store the encoded block of data in the memory.

2. The distributed storage system of claim 1, wherein the block of data is a portion of a data segment divided into a plurality of equally sized blocks of data.

3. The distributed storage system of claim 1, wherein the error-correcting code is a balanced and sparsest Reed-Solomon code.

4. The distributed storage system of claim 3, wherein the balanced and sparsest Reed-Solomon code further comprises transforming the block of data by a Reed-Solomon generator matrix.

5. The distributed storage system of claim 4, wherein the Reed-Solomon generator matrix is calculated by transforming a set of Reed-Solomon codewords with a mask that satisfies balanced and sparsest constraints.

6. The distributed storage system of claim 5, wherein the mask is selected from rows of a matrix, where the matrix comprises zeros and ones and satisfies balanced and sparsest constraints.

7. The distributed storage system of claim 6, wherein every row in the matrix has the same weight.

8. The distributed storage system of claim 6, wherein every column in the matrix has a weight that differs by at most one.

9. The distributed storage system of claim 4, wherein the Reed-Solomon generator matrix with parameters [6,4] defined over $\mathbb{F}_5$ can be evaluated by the processor using the following expression:

$$G = \begin{bmatrix} 3 & 1 & 4 & 0 & 0 & 0 \\ 0 & 0 & 0 & 3 & 1 & 4 \\ 0 & 3 & 1 & 4 & 0 & 0 \\ 4 & 0 & 0 & 0 & 3 & 1 \end{bmatrix}.$$

wherein G is the Reed-Solomon generator matrix, [6,4] are dimensions of the generator matrix, and $\mathbb{F}_5$ defines the dimensions of the subspace.

10. The distributed storage system of claim 4, wherein the Reed-Solomon generator matrix with parameters [15,10] defined over $\mathbb{F}_{2^4}$ can be evaluated by the processor using the following expression:

$$G_{15,10} = \begin{bmatrix} \alpha^8 & \alpha^9 & \alpha^{13} & \alpha^{10} & 1 & \alpha^8 & 0 & 0 & 0 & 0 & 0 & 0 & 0 & 0 & 0 \\ 0 & 0 & 0 & 0 & 0 & 0 & \alpha^8 & \alpha^9 & \alpha^{13} & \alpha^{10} & 1 & \alpha^8 & 0 & 0 & 0 \\ \alpha^{10} & 1 & \alpha^8 & 0 & 0 & 0 & 0 & 0 & 0 & 0 & 0 & 0 & \alpha^8 & \alpha^9 & \alpha^{13} \\ 0 & 0 & 0 & \alpha^8 & \alpha^9 & \alpha^{13} & \alpha^{10} & 1 & \alpha^8 & 0 & 0 & 0 & 0 & 0 & 0 \\ 0 & 0 & 0 & 0 & 0 & 0 & 0 & 0 & 0 & \alpha^8 & \alpha^9 & \alpha^{13} & \alpha^{10} & 1 & \alpha^8 \\ 0 & \alpha^8 & \alpha^9 & \alpha^{13} & \alpha^{10} & 1 & \alpha^8 & 0 & 0 & 0 & 0 & 0 & 0 & 0 & 0 \\ 0 & 0 & 0 & 0 & 0 & 0 & 0 & \alpha^8 & \alpha^9 & \alpha^{13} & \alpha^{10} & 1 & \alpha^8 & 0 & 0 \\ \alpha^{13} & \alpha^{10} & 1 & \alpha^8 & 0 & 0 & 0 & 0 & 0 & 0 & 0 & 0 & 0 & \alpha^8 & \alpha^9 \\ 0 & 0 & 0 & 0 & \alpha^8 & \alpha^9 & \alpha^{13} & \alpha^{10} & 1 & \alpha^8 & 0 & 0 & 0 & 0 & 0 \\ \alpha^8 & 0 & 0 & 0 & 0 & 0 & 0 & 0 & 0 & 0 & \alpha^8 & \alpha^9 & \alpha^{13} & \alpha^{10} & 1 \end{bmatrix}$$

wherein G is the Reed-Solomon generator matrix, [15,10] are dimensions of the generator matrix, and $\mathbb{F}_{2^4}$ defines the dimensions of the subspace, and a is a primitive in $\mathbb{F}_{2^4}$.

11. The distributed storage system of claim 4, wherein the Reed-Solomon generator matrix with parameters [14,10] defined over $\mathbb{F}_{2^4}$ can be evaluated by the processor using the following expression:

$$G_{14,10} = \begin{bmatrix} \alpha^8 & \alpha^9 & \alpha^{13} & \alpha^{10} & 1 & \alpha^8 & 0 & 0 & 0 & 0 & 0 & 0 & 0 & 0 \\ 0 & 0 & 0 & 0 & 0 & 0 & \alpha^8 & \alpha^9 & \alpha^{13} & \alpha^{10} & 1 & \alpha^8 & 0 & 0 \\ \alpha^{10} & 1 & \alpha^8 & 0 & 0 & 0 & 0 & 0 & 0 & 0 & 0 & 0 & \alpha^8 & \alpha^9 \\ 0 & 0 & 0 & \alpha^8 & \alpha^9 & \alpha^{13} & \alpha^{10} & 1 & \alpha^8 & 0 & 0 & 0 & 0 & 0 \\ 0 & 0 & 0 & 0 & 0 & 0 & 0 & 0 & 0 & \alpha^8 & \alpha^9 & \alpha^{13} & \alpha^{10} & 1 \\ 0 & \alpha^8 & \alpha^9 & \alpha^{13} & \alpha^{10} & 1 & \alpha^8 & 0 & 0 & 0 & 0 & 0 & 0 & 0 \\ 0 & 0 & 0 & 0 & 0 & 0 & 0 & \alpha^8 & \alpha^9 & \alpha^{13} & \alpha^{10} & 1 & \alpha^8 & 0 \\ \alpha^{13} & \alpha^{10} & 1 & \alpha^8 & 0 & 0 & 0 & 0 & 0 & 0 & 0 & 0 & 0 & \alpha^8 \\ 0 & 0 & 0 & 0 & \alpha^8 & \alpha^9 & \alpha^{13} & \alpha^{10} & 1 & \alpha^8 & 0 & 0 & 0 & 0 \\ \alpha^8 & 0 & 0 & 0 & 0 & 0 & 0 & 0 & 0 & 0 & \alpha^8 & \alpha^9 & \alpha^{13} & \alpha^{10} \end{bmatrix}$$

wherein G is the Reed-Solomon generator matrix, [14,10] are dimensions of the generator matrix, and $\mathbb{F}_{2^4}$ defines the dimensions of the subspace, and $\alpha$ is a primitive in $\mathbb{F}_{2^4}$.

12. A distributed storage network, comprising:
a communications network;
  a storage controller, comprising:
    a storage network interface;
    a storage processor;
    a storage memory containing a storage Reed-Solomon application;
  a plurality of node controllers configured to store a data file recoverable from a subset of the plurality of storage nodes, wherein the plurality of node controllers comprises:
    a node network interface;
    a node processor;
    a node memory containing a node Reed-Solomon application;
  wherein the storage processor is configured by the controller Reed-Solomon application to:
    receive a data segment;
    partition the data segment into at least a first block of data and a second block of data;
    transmit the first block of data to a first node controller in the plurality of node controllers;
    transmit the second block of data to a second node controller in the plurality of node controllers;
  wherein the node processor in the first node controller is configured by the node Reed-Solomon application to:
    receive the first block of data;
    encode the first block of data using a balanced and sparsest error-correcting code; and
    store the encoded first block of data in the node memory of the first node controller.

13. The distributed storage network of claim 12, wherein the first block of data and the second block of data are equal sized.

14. The distributed storage network of claim 12, wherein the error-correcting code is a balanced and sparsest Reed-Solomon code.

15. The distributed storage network of claim 14, wherein the balanced and sparsest Reed-Solomon code further comprises transforming the first block of data by a Reed-Solomon generator matrix.

16. The distributed storage network of claim 15, wherein the Reed-Solomon generator matrix is calculated by transforming a set of Reed-Solomon codewords with a mask that satisfies the balanced and sparsest constraints.

17. The distributed storage network of claim 16, wherein the mask is selected from rows of a matrix, where the matrix comprises zeros and ones and satisfies further balanced and sparsest constraints.

18. The distributed storage network of claim 17, wherein every row in the matrix has the same weight.

19. The distributed storage network of claim 17, wherein every column in the matrix has a weight that differs by at most one.

20. The distributed storage network of claim 12, wherein the storage processor is further configured by the controller Reed-Solomon application to:
- detect an erasure of the second block of data;
- retrieve blocks of data including at least the first block of data from the plurality of node controllers; and
- reconstruct the second block of data using a Reed-Solomon generator matrix and the retrieved blocks of data.

21. A distributed storage method, comprising:
- running a storage Reed-Solomon application contained in a storage memory using a storage controller, wherein the storage controller has a storage network interface, a storage processor, and a storage memory connected to the processor;
- receiving a data segment using the storage controller;
- storing the data segment among a plurality of node controllers by:
  - partitioning the data segment into a first block of data and a second block of data;
  - transmitting the first block of data to a first node controller, wherein the first node controller has a first node network interface, a first node processor, a first node memory connected to the first node processor, and a first node Reed-Solomon application contained in the first node memory;
  - transmitting the second block of data to a second node controller, wherein the second node controller has a second node network interface, a second node processor, a second node memory connected to the second node processor, and a second node Reed-Solomon application contained in the second node memory;
  - receiving the first block of data using the first node controller;
  - encoding the first block of data using a balanced and sparsest error-correcting code and the first node controller; and
  - storing the encoded first block of data in the first node memory using the first node controller;
- detecting an erasure of the second block of data using the storage controller;
- retrieving blocks of data from a subset of the plurality of node controllers including at least the first block of data from the first node controller using the storage controller; and
- reconstructing the second block of data using a Reed-Solomon generator matrix and the retrieved blocks of data using the storage controller.

* * * * *